(12) United States Patent
Hsu et al.

(10) Patent No.: US 6,430,060 B1
(45) Date of Patent: Aug. 6, 2002

(54) APPARATUS FOR SUPPORTING AN ELECTRONIC EQUIPMENT

(75) Inventors: Chih-Min Hsu; Yi-Jen Chen, both of Taipei (TW)

(73) Assignee: ASUSTek Computer Inc., Taipei (TW)

( * ) Notice: Subject to any disclaimer, the term of this patent is extended or adjusted under 35 U.S.C. 154(b) by 0 days.

(21) Appl. No.: 09/654,910

(22) Filed: Sep. 1, 2000

(30) Foreign Application Priority Data

Jan. 4, 2000 (TW) ...................................... 89200069 U

(51) Int. Cl.[7] .............................. H04B 1/03; H05K 5/02
(52) U.S. Cl. ...................................................... 361/814
(58) Field of Search ................................ 361/737, 736, 361/740, 741, 747, 752, 756, 759, 755, 809, 810, 814; 439/135, 136, 142

(56) References Cited

U.S. PATENT DOCUMENTS

| 5,198,966 A | * | 3/1993 | Kobayashi et al. ......... 361/395 |
| 5,530,620 A | * | 6/1996 | Sangveraphunsiri ........ 361/686 |
| 5,557,499 A | * | 9/1996 | Reiter et al. ................ 361/685 |
| 6,113,046 A | * | 9/2000 | Wang .......................... 248/278 |

* cited by examiner

Primary Examiner—David Martin
Assistant Examiner—Thanh S. Phan
(74) Attorney, Agent, or Firm—Rabin & Berdo, P.C.

(57) ABSTRACT

The present invention provides an apparatus for supporting electronic equipment. The electronic equipment comprises a groove, a first engagement mechanism and a second engagement mechanism. The apparatus comprises a main body, a first component and a second component. The main body has a turning spindle disposed within the groove. The first component and the second component locate on the main body. While the first component is coupled with the first engagement mechanism, the apparatus extends and the electronic equipment is vertical. While the second component is coupled with the second engagement mechanism, the apparatus retracts and the electronic equipment is horizontal.

5 Claims, 5 Drawing Sheets

APPARATUS FOR SUPPORTING AN ELECTRONIC EQUIPMENT

BACKGROUND OF THE INVENTION

1. Field of Invention

The present invention relates to a supporting apparatus, and more particularly, to an apparatus for supporting an electronic equipment.

2. Descriptions of Related Arts

Please refer to FIG. 1. FIG. 1 is a side view of the conventional apparatus for supporting an electronic equipment 12. This invention employs an extra leg 11 to support electronic equipment 12, and the electronic equipment 12 can be vertically positioned. There are some disadvantages in this case.

1. Waste of material and too expensive by using extra leg 11.

2. It is easy to lose extra leg 11.

SUMMARY OF THE INVENTION

It is therefore an objective of the present invention to provide an apparatus for supporting the electronic equipment to solve the above-mentioned problem.

In a preferred embodiment, the present invention concerns the apparatus for supporting the electronic equipment. The electronic equipment includes a groove, a first engagement mechanism and a second engagement mechanism. The apparatus includes a main body, a first component and a second component. The main body has a turning spindle disposed within the groove. The first component and the second component are located on the main body. While the first component is coupled with the first engagement mechanism, the apparatus extends and the electronic equipment is vertical. While the second component is coupled with the second engagement mechanism, the apparatus retracts and the electronic equipment is horizontal.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
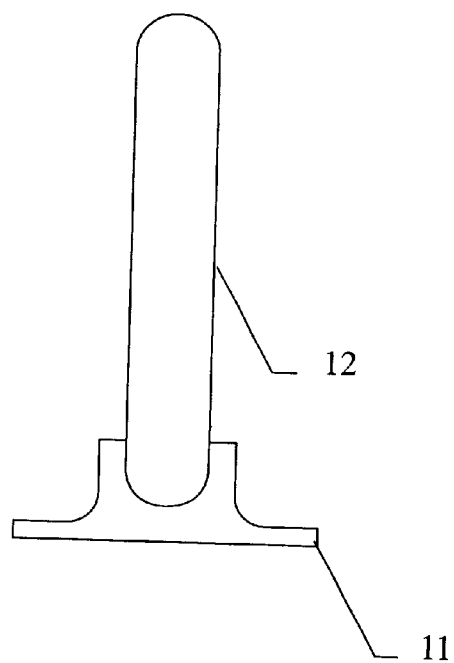
FIG. 1 is a side view of the apparatus for supporting the electronic equipment according to the prior art.
Figure 2:
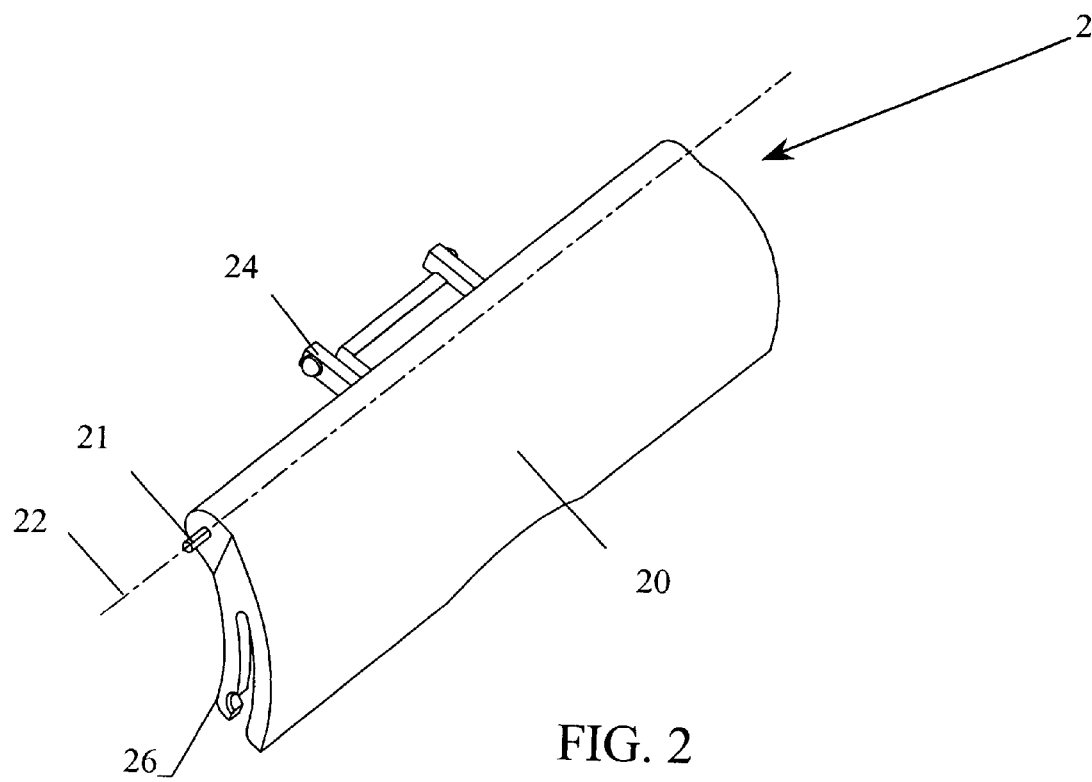
FIG. 2 is a schematic diagram of the apparatus for supporting the electronic equipment according to the present invention.

Please refer to FIG. 2. FIG. 2 is a schematic diagram of the apparatus 2 for supporting the electronic device 201 shown in FIG. 3 according to the present invention. The apparatus 2 includes a main body 20, a first component 24 and a second component 26. The main body 20 is made of a selected material and has a regular form. The main body 20 has a turning 21 located on the opposite sides of the main body 20 and therefore the main body 20 can revolve around a revolving axis 22. The first component 24 is located on the top of the main body 20. The second component 26 is located on the opposite sides of the main body 20. The second component 26 is a resilient member.

Figure 3:
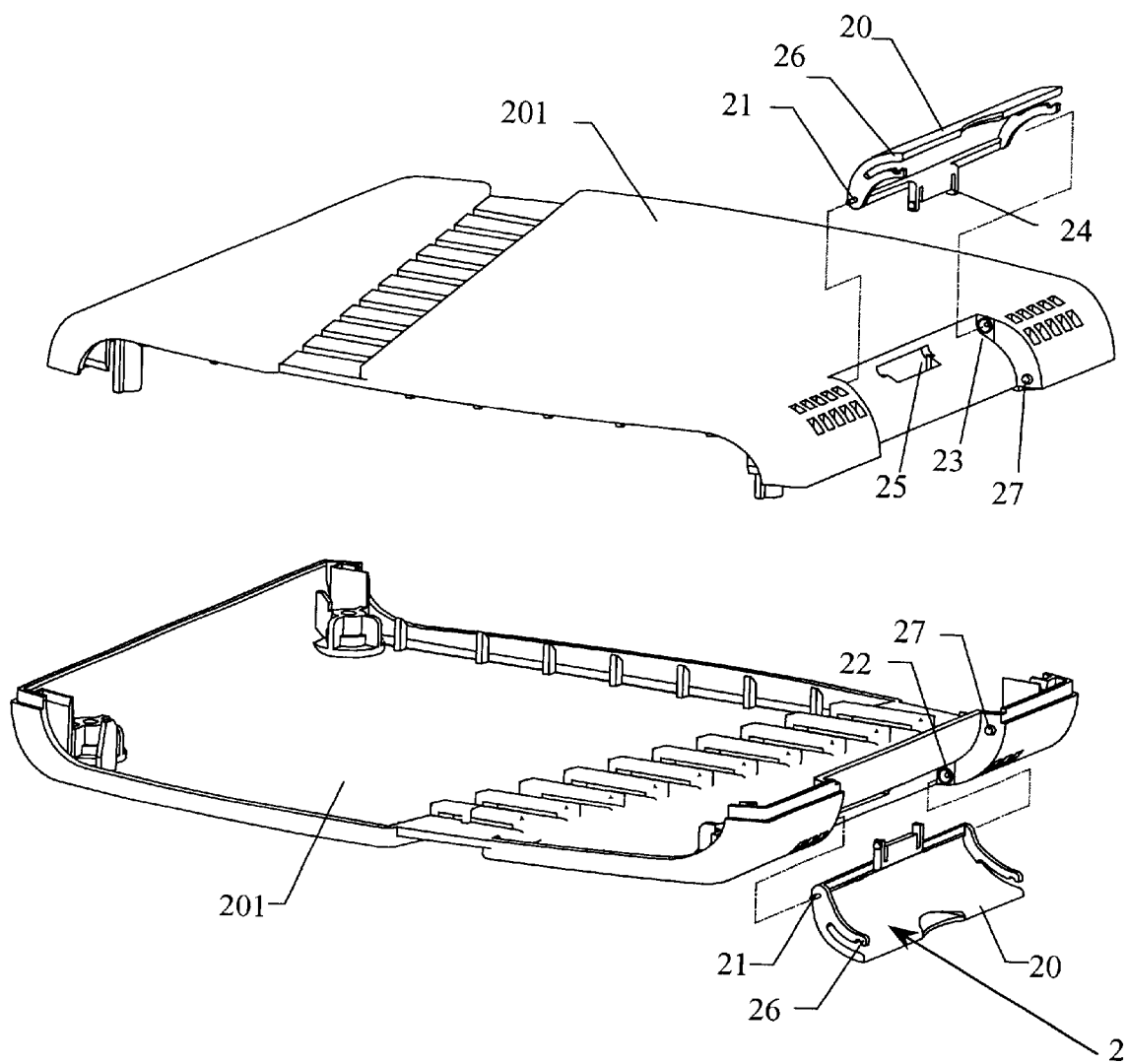
FIG. 3 is an exploded view of the apparatus and the electronic equipment.

Please refer to FIG. 3. FIG. 3 is an exploded view of the apparatus 2 and the electronic device 201. The electronic device 201 includes a housing having a recess, and a first set of receiving holes 23. A first engagement hole 25 is formed at a bottom of the recess, and opposing pins 27 are disposed on opposite sides of the recess. The assembly procedure of the electronic device 201 and the main body 20 is to bend the main body 20 and insert the spindle 21 into the receiving holes 23 of the electronic device 201. Then the bended main body 20 will recover itself due to the elasticity of materials.

Figure 4:
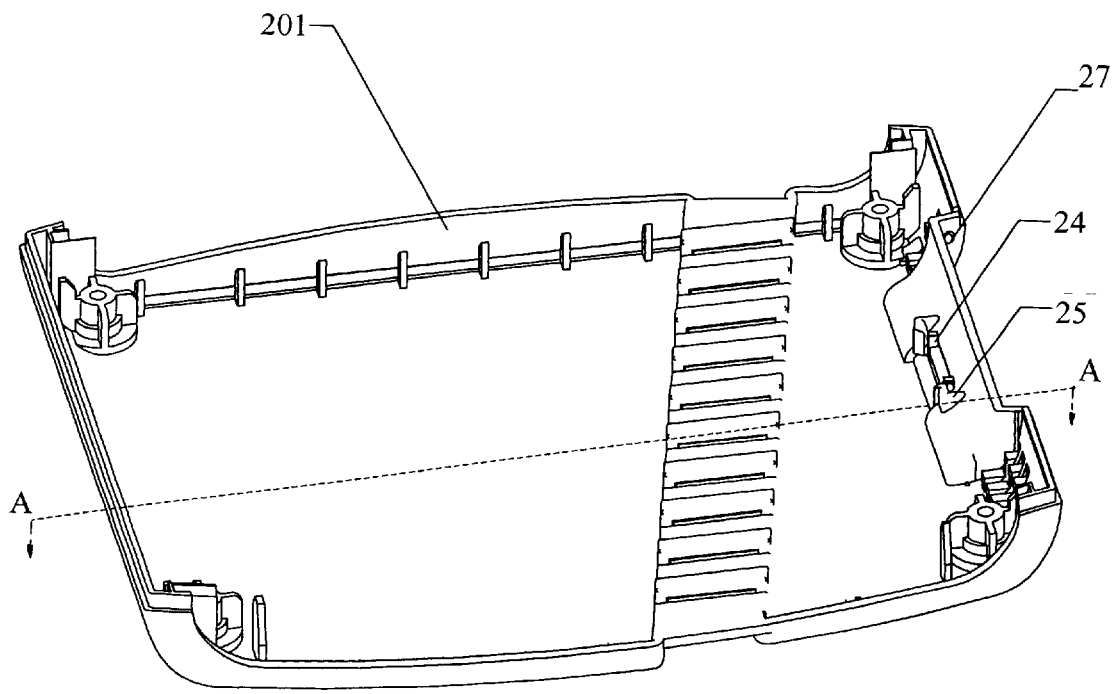
FIG. 4 is a schematic diagram described how the apparatus extends.
Figure 5:
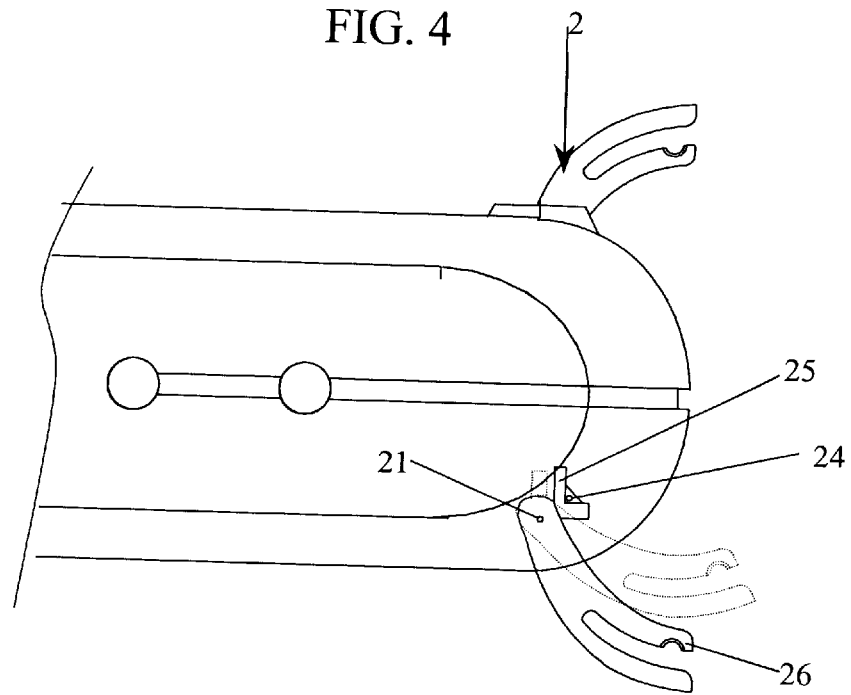
FIG. 5 is a sectional view along line A—A of the apparatus shown in FIG. 4.

Please refer to FIG. 4 and FIG. 5. FIG. 4 is a schematic diagram showing how the apparatus 2 extends. FIG. 5 is a sectional view along line A–A of the apparatus 2 shown in FIG. 4. The main body 20 revolves clockwise around the spindle 21 to a first position, as well as the main body 20 revolves from a dotted line to the line as shown in FIG. 5. At the same time, the first component 24 of the main body 20 is coupled to the first engagement hole 25 of the electronic device 201. The main body 20 can thus be affixed in some selected positions by this method. The main body 20 of the apparatus 2 extends away from the electronic device 201.

Figure 6:
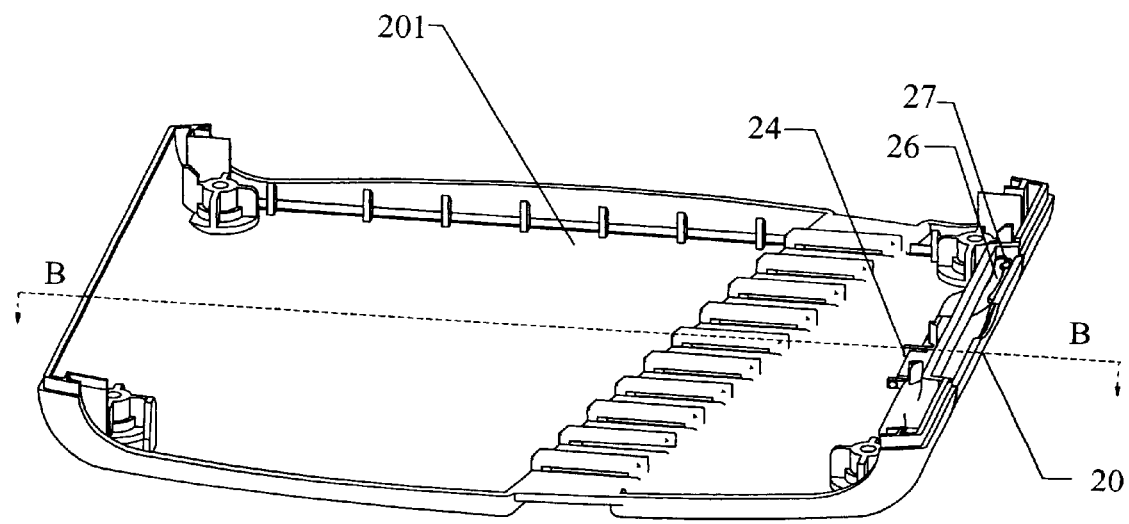
FIG. 6 is a schematic diagram described how the apparatus retracts.
Figure 7:
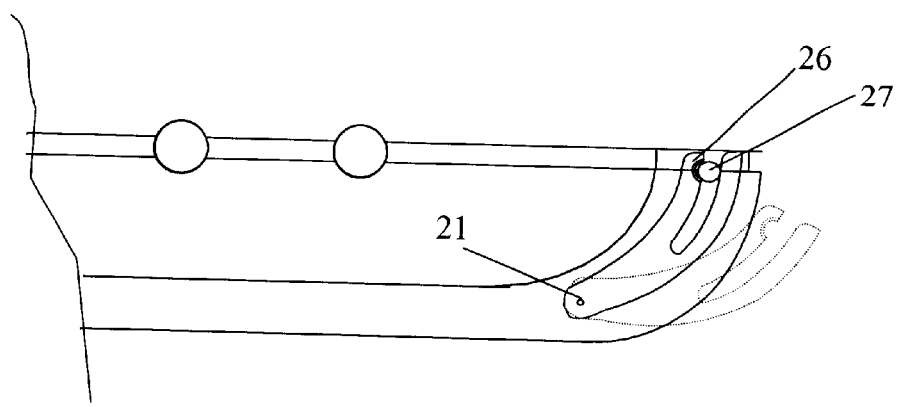
FIG. 7 is a sectional view along line B—B of the apparatus shown in FIG. 6.

Please refer to FIG. 6 and FIG. 7. FIG. 6 is a schematic diagram described the retraction of the apparatus 2. FIG. 7 is a sectional view along line B—B of the apparatus shown in FIG. 6. The main body 20 revolves counter-clockwise around spindle 21 to a second position, as well as the main body 20 revolves from a dotted line to the line as shown in FIG. 7. At the same time, the second component 26 of the main body 20 is coupled with the opposing pins 27 of the electronic device 201. The main body 20 can be affixed in some selected positions by this method. The main body 20 of the apparatus 2 retracts into the electronic equipment 201. FIGS. 4, 5, 6 and 7 show how the main body 20 of the apparatus 2 extends and retracts.

Figure 8:
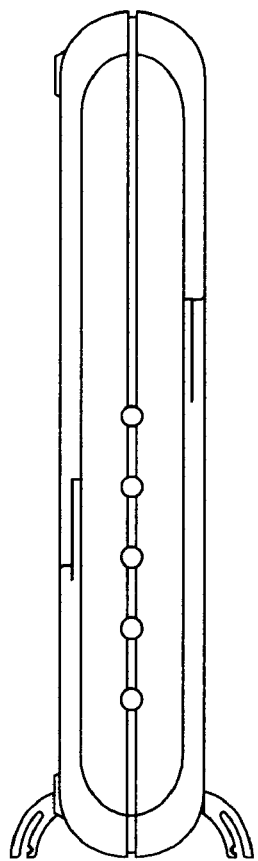
FIG. 8 is a side view described that the electronic equipment shown in FIG. 2 is vertical.
Figure 9:
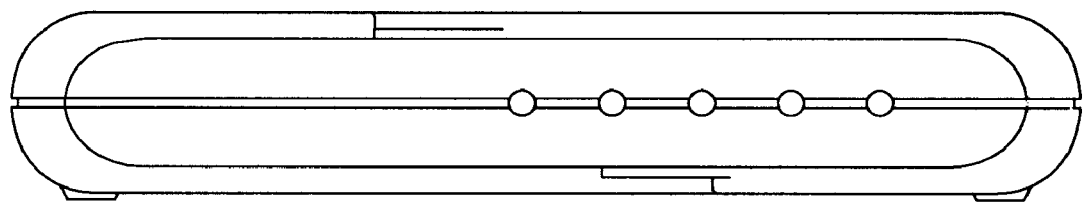
FIG. 9 is a side view described that the electronic equipment shown in FIG. 2 is horizontal.

Please refer to FIG. 8 and FIG. 9. FIG. 8 is a side view which shows that the electronic device 201 shown in FIG. 2 is vertical. FIG. 9 is a side view which describes that the electronic device 201 shown in FIG. 2 is horizontal. The apparatus 2 of the present invention for supporting the electronic device 201 provides support while the apparatus 2 is extended, so that the electronic device 201 can be positioned vertically. The geometry model of the electronic device 201 is smooth while the apparatus 2 is retracted, so that the electronic device 201 can be positioned horizontally.

In a preferred embodiment, the present invention provides an apparatus to support the electronic device, and more particularly, to support a modem. The apparatus of the present invention for supporting the electronic device symmetrically operates with two main bodies. The components and the engagement mechanisms are symmetrically located in corresponding positions, too. As a result, the main bodies can extend or retract with the components of the main body and the engagement mechanisms of the electronic device. The apparatus further supports the electronic device, and the electronic device can be vertical or horizontal.

In contrast to the prior art with an extra leg, the present invention has some advantages as follows.

1. It minimizes the use of material compared with employing an extra leg to support the electronic equipment.
2. It is not easy to lose.
3. The shape of the electronic equipment is not changed.
4. The main bodies can be fully extended or retracted with the components of the main body and the engagement mechanisms of the electronic equipment.

With the example and explanations of the above, the features and spirits of the invention hopefully can be well described. Those skilled in the art will readily observe that numerous modifications and alterations of the device may be made while retaining the teaching of the invention. Accordingly, the above disclosure shall be construed as limited only by the metes and bounds of the appended claims.

What is claimed is:

1. In combination,
   an electronic device having a housing, a recess formed in the housing, opposing receiving holes formed in the housing and on opposite sides of the recess, opposing pins disposed on the opposite sides of the recess, and an engagement hole formed in the housing and disposed at a bottom of the recess and between the opposing receiving holes, and
   an apparatus for supporting the electronic device, comprising:
      a main body having a turning spindle disposed within the opposing receiving holes, the main body being pivotal about an axis of the turning spindle;
      a first component located on the main body and being engageable with the engagement hole when the main body is pivoted to be extended relative to the housing; and
      a second component located on the main body and being engageable with the opposing pins when the main body is retracted into the recess.

2. The combination of claim 1, wherein the apparatus holds the electronic device in a vertical position when the main body is.

3. The combination of claim 1, wherein the electronic device is positionable in a horizontal position when the main body is retracted into the recess.

4. The combination of claim 1, wherein the electronic device is a modem.

5. In combination,
an electronic device having:
   a housing,
   a first recess formed in the housing,
   a first set of opposing receiving holes formed in the housing and on opposite sides of the first recess,
   a first set of opposing pins disposed on the opposite sides of the first recess,
   a first engagement hole formed in the housing and disposed at a bottom of the first recess and between the first set of opposing receiving holes,
   a second recess formed in the housing,
   a second set of opposing receiving holes formed in the housing and on opposite sides of the second recess,
   a second set of opposing pins disposed on the opposite sides of the second recess, and
   a second engagement hole formed in the housing and disposed at a bottom of the second recess and between the second set of opposing receiving holes,
   and an apparatus for supporting the electronic device, comprising:
      a first main body having a first turning spindle disposed within the first set of opposing receiving holes, the first main body being pivotal about an axis of the first turning spindle;
      a first component located on the first main body and being engageable with the first engagement hole when the first main body is extended relative to the housing;
      a second component located on the first main body and being engageable with the first set of opposing pins when the first main body is retracted into the first recess,
      a second main body having a second turning spindle disposed within the second set of opposing receiving holes, the second main body being pivotal about an axis of the second turning spindle;
      a third component located on the second main body and being engageable with the second engagement hole when the second main body is extended relative to the housing; and
      a fourth component located on the second main body and being engageable with the second set of opposing pins when the second main body is retracted into the second recess.

* * * * *